(12) United States Patent
Partsch et al.

(10) Patent No.: US 6,956,786 B2
(45) Date of Patent: Oct. 18, 2005

(54) RANDOM ACCESS MEMORY WITH OPTIONAL INACCESSIBLE MEMORY CELLS

(75) Inventors: Torsten Partsch, Raleigh, NC (US); Thoai Thai Le, Cary, NC (US)

(73) Assignee: Infineon Technologies North America Corp., San Jose, CA (US)

(*) Notice: Subject to any disclaimer, the term of this patent is extended or adjusted under 35 U.S.C. 154(b) by 20 days.

(21) Appl. No.: 10/727,406

(22) Filed: Dec. 4, 2003

(65) Prior Publication Data

US 2005/0122822 A1 Jun. 9, 2005

(51) Int. Cl.$^7$ ............................................. G11C 8/00
(52) U.S. Cl. ............. 365/230.03; 365/195; 365/230.04
(58) Field of Search ................... 365/230.03, 230.04, 365/230.06, 195, 196, 225.7

(56) References Cited

U.S. PATENT DOCUMENTS

| | | | | |
|---|---|---|---|---|
| 6,134,179 A | * | 10/2000 | Ooishi | 365/233 |
| 6,137,745 A | * | 10/2000 | Lin et al. | 365/230.03 |
| 6,154,389 A | * | 11/2000 | Chung et al. | 365/185.09 |
| 6,317,355 B1 | | 11/2001 | Kang | |
| 6,336,202 B1 | | 1/2002 | Tsuchimoto et al. | |
| 6,418,068 B1 | | 7/2002 | Raynham | |
| 6,480,429 B2 | | 11/2002 | Jones et al. | |

* cited by examiner

*Primary Examiner*—Gene N. Auduong
(74) *Attorney, Agent, or Firm*—Dicke, Billig & Czaja, P.L.L.C.

(57) ABSTRACT

A random access memory comprises a plurality of data pads and an array of memory cells comprising a first portion of memory cells and a second portion of memory cells. The random access memory comprises a first line configured to receive first data signals between the first portion of memory cells and the data pads and a second line configured to receive second data signals between the second portion of memory cells and the data pads. The first portion of memory cells is configured to be made inaccessible to eliminate the first data signals and a first number of the data pads and the second portion of memory cells is configured to be made inaccessible to eliminate the second data signals and a second number of the data pads.

35 Claims, 6 Drawing Sheets

RANDOM ACCESS MEMORY WITH OPTIONAL INACCESSIBLE MEMORY CELLS

BACKGROUND

Synchronous dynamic random access memory (SDRAM) chips are produced in a variety of storage capacities including, 128-Mbit, 256-Mbit, and 512-Mbit. In general, each memory chip includes at least one array of memory cells. The memory cells are arranged in rows and columns, with the rows extending along an x-direction and the columns extending along a y-direction. Conductive word lines extend across the array of memory cells along the x-direction and conductive bits lines extend across the array of memory cells along the y-direction. A memory cell is located at each cross point of a word line and bit line. Memory cells are accessed using a row address and a column address.

Memory chips are often manufactured with larger storage capacities and reduced to smaller storage capacities for sale. Reducing the storage capacity can occur for a number of reasons, including the chip contains more memory cell defects than can be repaired using normal redundancy techniques or a smaller capacity memory chip provides a larger profit margin.

For memories with storage capacities such as 128-Mbit and 256-Mbit storage capacities, doubling the storage capacity of the memory means doubling the number of memory cells. The additional memory cells can be addressed by doubling the number of rows. An additional row address bit is therefore required. For these memories, it is simple to halve the storage capacity by shorting the most significant row address bit to either a logic high level or a logic low level. If the most significant row address bit is shorted to a logic high level, the lower half of the memory is disabled. If the most significant row address bit is shorted to a logic low level, the upper half of the memory is disabled. For example, to disable the lower half of a 256-Mbit chip, the most significant row address bit is shorted to a logic low level, resulting in a 128-Mbit chip.

For conforming memories with 512-Mbit storage capacities and higher (i.e. one that complies with Joint Electron Device Engineering Council (JEDEC) standards), the addressable cells are doubled by doubling the number of columns and adding an additional column address, rather than adding rows. A conforming 512-Mbit chip has a page length of 16 k bits (equal to the number of columns) while a conforming 256-Mbit chip has a page length of 8 k bits. Therefore, simply shorting the most significant row address bit to a logic high level or logic low level to reduce the addressable memory cells results in a nonconforming SDRAM. Nonconforming memory chips cannot be sold in the commodity SDRAM market. For example, if a 512-Mbit chip is reduced to a 256-Mbit chip by shorting the most significant row address bit to a logic high level or logic low level, the resulting 256-Mbit chip still has a page length of 16 k bits, which is nonconforming.

In addition, shorting the most significant column address bit of a 512-Mbit chip to a logic high level or a logic low level results in a chip in which array addressing can conflict with data pad organizations. SDRAM chips typically have one die solutions for multiple data pad (DQ) organizations. Depending upon whether the memory chip has 4, 8, or 16 DQs (x4, x8, x16 DQ organization), the number of column address bits will vary. For example, assuming a 512-Mbit DDR SDRAM with x16 organization, 16 k array cells are connected to an activated row and 32 bits are addressed per memory access. Therefore, nine column address bits are needed to access all the data in one row. For a 512-Mbit DDR SDRAM with x8 organization, ten column address bits are needed to access all the data in one row. The most significant column address bit depends on the DQ organization. To short the most significant column address bit to a logic high level or a logic low level would require coordination with the DQ organization.

A lower column address bit can be shorted to a logic high level or a logic low level to reduce the size of the addressable memory, but this has several disadvantages. Using a lower column address bit limits the addressable block size. Limiting the addressable block size limits the size of cluster fails that can be bypassed as a cluster fail could extend beyond one block. In addition, using a lower column address bit can interfere with or destroy normal column redundancy techniques, as a redundant column could be located in a deactivated section leaving a column in an addressable section without a redundant column.

SUMMARY

One aspect of the present invention provides a random access memory. The random access memory comprises a plurality of data pads and an array of memory cells comprising a first portion of memory cells and a second portion of memory cells. The random access memory comprises a first line configured to receive first data signals between the first portion of memory cells and the data pads and a second line configured to receive second data signals between the second portion of memory cells and the data pads. The first portion of memory cells is configured to be made inaccessible to eliminate the first data signals and a first number of the data pads and the second portion of memory cells is configured to be made inaccessible to eliminate the second data signals and a second number of the data pads.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
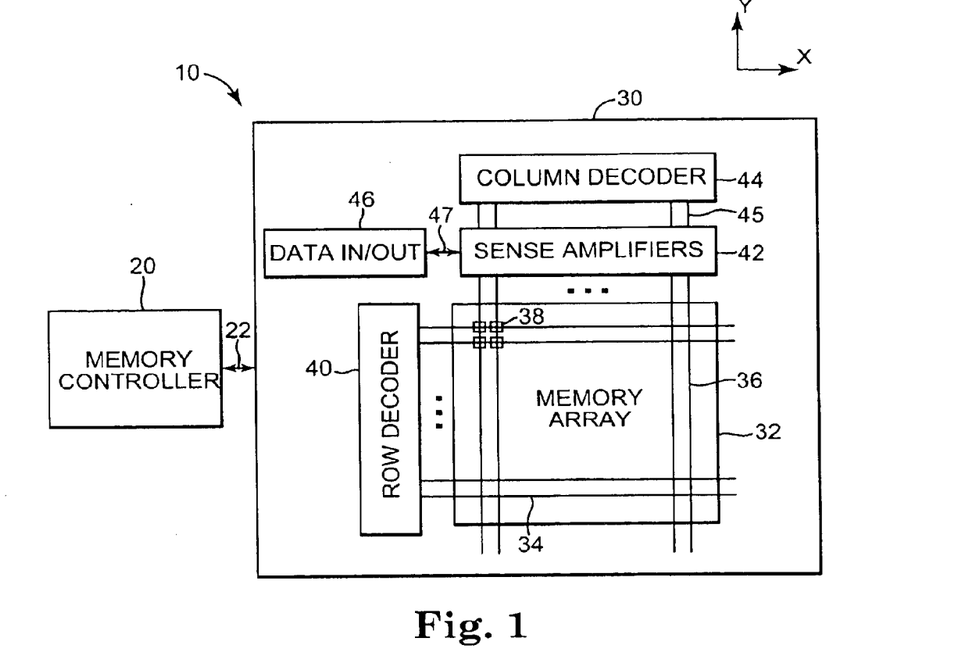
FIG. 1 is a block diagram illustrating an exemplary embodiment of a DDR SDRAM, according to the present invention.

FIG. 1 is a block diagram illustrating a random access memory 10. In one embodiment, random access memory 10 is a double data rate synchronous dynamic random access memory (DDR SDRAM). The DDR SDRAM 10 includes a memory controller 20 and at least one memory bank 30. Memory bank 30 includes an array of memory cells 32, a row decoder 40, a column decoder 44, sense amplifiers 42, and data in/out circuit 46. In other embodiments, data in/out circuit 46 is separate from memory bank 30. Memory controller 20 is electrically coupled to memory bank 30, indicated at 22.

Conductive word lines 34, referred to as row select lines, extend in the x-direction across the array of memory cells 32. Conductive bit lines 36, controlled by the column select lines, extend in the y-direction across the array of memory cells 32. A memory cell 38 is located at each cross point of a word line 34 and a bit line 36. Each word line 34 is electrically coupled to row decoder 40 and each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes data input/output (I/O) circuitry and pins (DQs) to transfer data between memory bank 30 and an external device. Data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

The array of memory cells 32 includes a first portion of memory cells and a second portion of memory cells. A first portion of data lines 47 are configured to pass first data signals between a first portion of DQs and the first portion of memory cells and a second portion of data lines 47 are configured to pass second data signals between a second portion of DQs and the second portion of memory cells. The first and second portions of memory cells are configured to be made inaccessible to eliminate the first and second data signals respectively and the first and second portions of DQs respectively.

Memory controller 20 controls reading data from and writing data to memory bank 30. During a read operation, memory controller 20 passes the row address of a selected memory cell 38 to row decoder 40. Row decoder 40 activates the selected word line 34. As the selected word line 34 is activated, the value stored in each memory cell 38 coupled to the selected word line 34 is passed to the respective bit line 36. The value of each memory cell 38 is read by a sense amplifier 42 electrically coupled to the respective bit line 36. Memory controller 20 also passes a column address of the selected memory cell 38 to column decoder 44. Column decoder 44 selects which sense amplifiers 42 pass data to data in/out circuit 46 for retrieval by an external device.

During a write operation, the data to be stored in array 32 is placed in data in/out circuit 46 by an external device. Memory controller 20 passes the row address for the selected memory cell 38 where the data is to be stored to row decoder 40. Row decoder 40 activates the selected word line 34. Memory controller 20 passes the column address for the selected memory cell 38 where the data is to be stored to column decoder 44. Column decoder 44 selects which sense amplifiers 42 are passed the data from data in/out circuit 46. Sense amplifiers 42 write the data to the selected memory cell 38 through bit lines 36.

Figure 2:
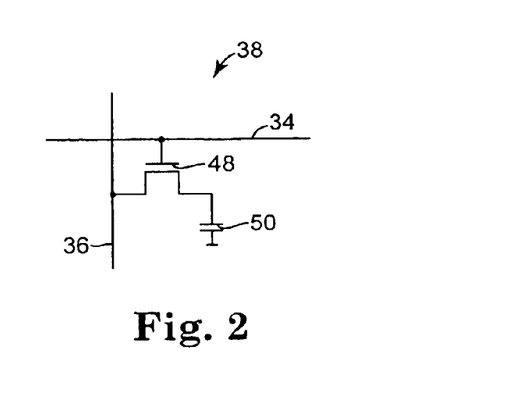
FIG. 2 is a diagram illustrating an exemplary embodiment of a memory cell.

FIG. 2 illustrates an exemplary embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to bit line 36 and capacitor 50. Capacitor 50 is charged to represent either a logic 0 or a logic 1. During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading the value from and then writing the value back to the memory cell 38. All memory cells 38 within the array of memory cells 32 are periodically refreshed to maintain their values.

In DDR SDRAM, the read and write operations are synchronized to a system clock. The system clock is supplied by a host system including the DDR SDRAM 10. Operations are performed on both the rising and falling edges of the system clock. DDR SDRAM uses a double data rate architecture to achieve high speed operation. The double data rate architecture is essentially a 2n prefetch architecture with an interface designed to transfer two data words per clock cycle at the DQs. A single read or write access for the DDR SDRAM effectively consists of a single 2n bit wide, one clock cycle data transfer at the internal memory array and two corresponding n bit wide, one half clock cycle data transfers at the DQs.

A bidirectional data strobe (DQS) is transmitted externally along with data for use in data capture at data in/out circuit 46. DQS is a strobe transmitted by the DDR SDRAM during read operations and by an external memory controller during write operations. DQS is edge aligned with data for read operations and center aligned with data for write operations. Input and output data is registered on both edges of DQS.

DDR SDRAM operates from a differential clock, CK and bCK. The crossing of CK going high and bCK going low is referred to as the positive edge of CK. Commands such as read and write operations, including address and control signals, are registered at the positive edge of CK.

Read and write accesses to the DDR SDRAM are burst oriented. Accesses start at a selected location and continue for a programmed number of locations in a programmed sequence. Accesses begin with the registration of an active command, which is followed by a read or write command. The address bits registered coincident with the active command are used to select the bank and row to be accessed. The address bits registered coincident with the read or write command are used to select the bank and the starting column location for the burst access.

Figure 3:
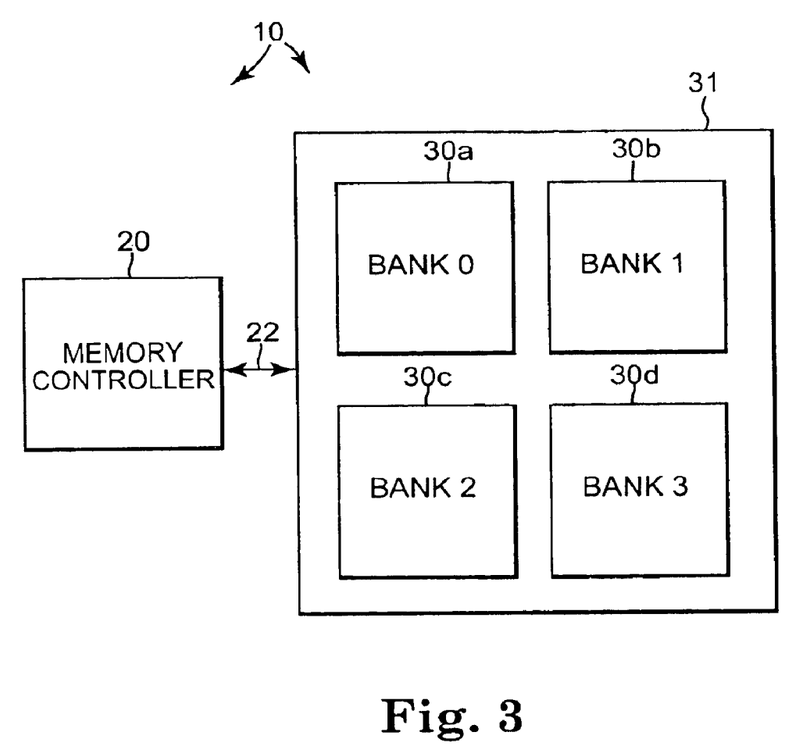
FIG. 3 is a block diagram illustrating an exemplary embodiment of a DDR SDRAM with multiple memory banks.

FIG. 3 is a block diagram illustrating an exemplary embodiment of DDR SDRAM 10 with an array of memory banks 31. The array of memory banks 31 includes four memory banks, bank zero through bank three, indicated at 30a–30d. Each memory bank 30a–30d includes all of the circuitry of memory bank 30 illustrated in FIG. 1 and previously described. In one embodiment, a single data in/out circuit 46 is shared by memory banks 30a–30d. Multiple memory banks 30a–30d increase the storage capacity of DDR SDRAM 10 and reduce the access time of DDR SDRAM 10 as one bank can be prepared for access while another bank is being accessed.

Figure 4:
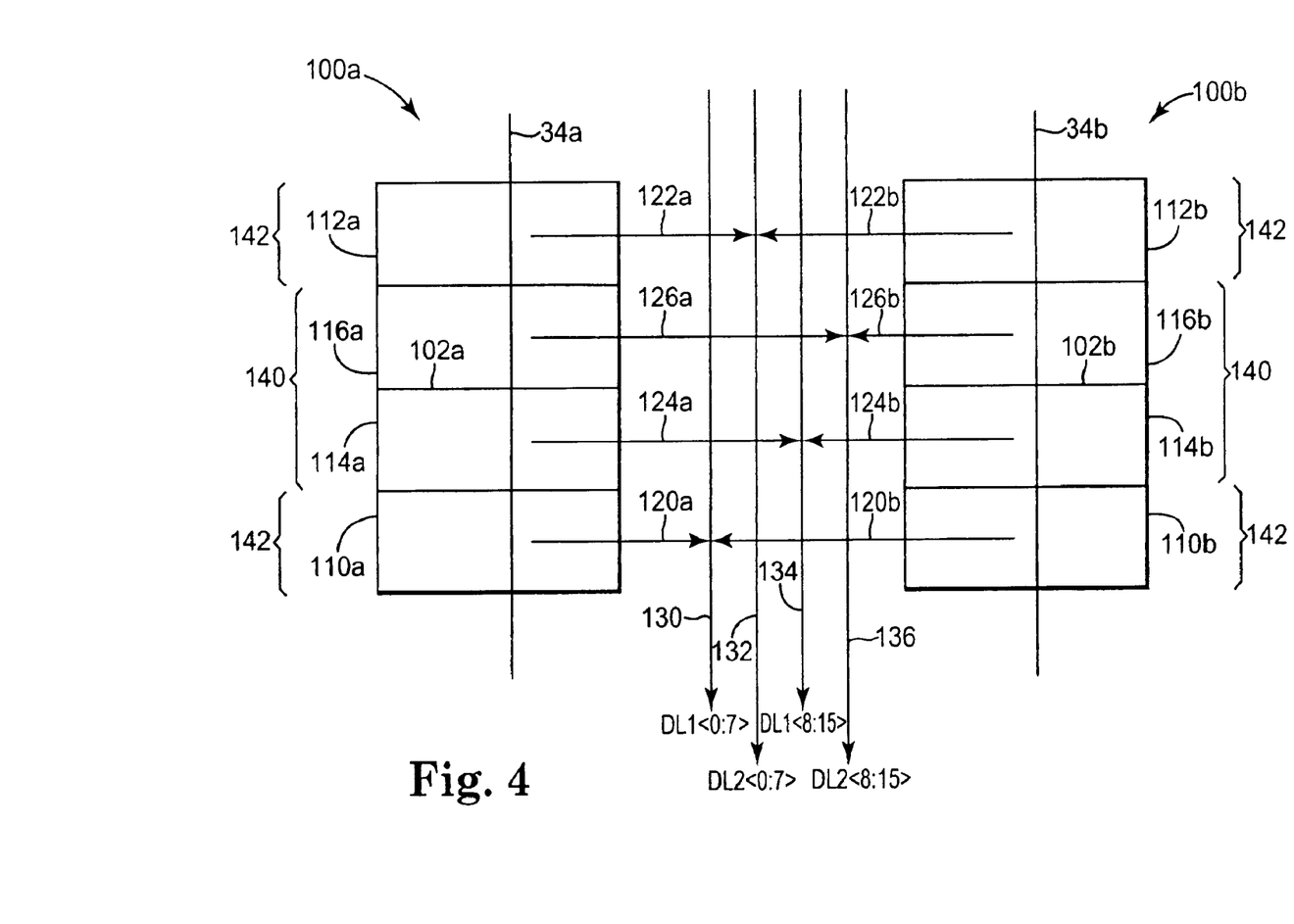
FIG. 4 is a block diagram illustrating an exemplary portion of two memory banks of a DDR SDRAM including two cut down options.

FIG. 4 illustrates a portion of bank zero 100a and a portion of bank one 100b of DDR SDRAM 10. In the exemplary embodiment, DDR SDRAM 10 is in a x16 DQ organization. The portion of bank zero 100a includes word line 34a, multiple bit lines, blocks of memory cells 110a, 112a, 114a, and 116a, even and odd data dividing line 102a, and data lines 120a, 122a, 124a, and 126a. The portion of bank one 100b includes word line 34b, multiple bit lines, blocks of memory cells 110b, 112b, 114b, and 116b, even and odd data dividing line 102b, and data lines 120b, 122b, 124b, and 126b. The portion of bank zero 100a and the portion of bank one 100b use data lines DL1<0:7>130, DL2<0:7>132, DL1<8:15>134, and DL2<8:15>136.

In the portion of bank zero 100a, each block of memory cells 110a, 112a, 114a, and 116a, includes at least eight memory cells 38 along word line 34a. The memory cells 38 of block 110a are electrically coupled to data line 120a through sense amplifiers 42 of bank zero 30a. The memory cells 38 of block 112a are electrically coupled to data line 122a through sense amplifiers 42 of bank zero 30a. The memory cells 38 of block 114a are electrically coupled to data line 124a through sense amplifiers 42 of bank zero 30a and the memory cells 38 of 116a are electrically coupled to data line 126a through sense amplifiers 42 of bank zero 30a. Data line 120a is electrically coupled to data line DL1<0:7>130. Data line 122a is electrically coupled to data line DL2<0:7>132. Data line 124a is electrically coupled to data line DL1<8:15>134 and data line 126a is electrically coupled to data line DL2<8:15>136.

For the portion of bank one 100b, each block of memory cells 110b, 112b, 114b, and 116b, includes at least eight memory cells 38 along word line 34b. The memory cells 38 of block 110b are electrically coupled to data line 120b through sense amplifiers 42 of bank one 30b. The memory cells 38 of block 112b are electrically coupled to data line 122b through sense amplifiers 42 of bank one 30b. The memory cells 38 of block 114b are electrically coupled to data line 124b through sense amplifiers 42 of bank one 30b and the memory cells 38 of 116b are electrically coupled to data line 126b through sense amplifiers 42 of bank one 30b. Data line 120b is electrically coupled to data line DL1<0:7>130. Data line 122b is electrically coupled to data line DL2<0:7>132. Data line 124b is electrically coupled to data line DL1<8:15>134 and data line 126b is electrically coupled to data line DL2<8:15>136.

Data lines 120a, 122a, 124a, 126a, 120b, 122b, 124b, 126b, DL1<0:7>130, DL2<0:7>132, DL1<8:15>134, and DL2<8:15>136 are data busses or other suitable data transmission lines for carrying at least eight data bits at a time to pass data into or out of the portion of bank zero 100a and the portion of bank one 100b. In other embodiments, the data lines are configured for carrying any suitable number of data bits. Word lines 34a and 34b activate the selected memory cells 38 during a read or write operation as previously described.

In the exemplary embodiment, DDR SDRAM 10 is in a x16 DQ organization and 32 data bits are read, two per DQ, per memory read access. Likewise, 32 data bits are written, two per DQ, per memory write access. The first 16 data bits on the DQs are referred to as the even data bits. The second 16 data bits on the DQs are referred to as the odd data bits.

The array of memory cells 32 in each bank 30a–30d of DDR SDRAM 10 is divided into even and odd sections to facilitate the data transfer.

Even and odd data dividing line 102a divides the upper and lower half of bank zero portion 100a. The lower half of bank zero portion 100a includes block 110a and block 114a, which represent the even data. The upper half of bank zero portion 100a includes block 112a and block 116a, which represent the odd data.

Even and odd data dividing line 102b divides the upper and lower half of bank one portion 100b. The lower half of bank one portion 100b includes block 110b and block 114b, which represent the even data. The upper half of bank one portion 100b includes block 112b and block 116b, which represent the odd data.

Data line 120a passes data from the memory cells 38 in block 110a to data line DL1<0:7>130 during a read operation. Data line 120a passes data from data line DL1<0:7>130 to memory cells 38 in block 110a during a write operation. Data line 120b passes data from the memory cells 38 in block 110b to data line DL1<0:7>130 during a read operation. Data line 120b passes data from data line DL1<0:7>130 to memory cells 38 in block 110b during a write operation.

Data lines 122a and 122b with data line DL2<0:7>132 perform the same function for their respective blocks 112a and 112b as data lines 120a and 120b. Data lines 124a and 124b with data line DL1<8:15>134 perform the same function for their respective blocks 114a and 114b as data lines 120a and 120b and data lines 126a and 126b with data line DL2<8:15>136 perform the same function for their respective blocks 116a and 116b as data lines 120a and 120b.

Data line DL1<0:7>130 passes data from data lines 120a and 120b to the first eight DQs (eight least significant DQs) to output as even data. Data line DL2<0:7>132 passes data from data lines 122a and 122b to the first eight DQs to output as odd data. Data line DL1<8:15>134 passes data from data lines 124a and 124b to the second eight DQs (eight most significant DQs) to output as even data. Data line DL2<8:15>136 passes data from data lines 126a and 126b to output as odd data. On the rising edge of a clock pulse, the data on data lines DL1<0:7>130 and DL1<8:15>134 is output to the 16 DQs and on the falling edge of the clock pulse, the data on data lines DL2<0:7>132 and DL2<8:15>136 is output to the 16 DQs.

One of the banks 30a–30d is read from or written to during each memory access. Further, one portion of one bank 30a–30d, such as the portion of bank zero 100a or the portion of bank one 100b, is read from or written to during each memory access. The other portions of bank zero 30a and bank one 30b are treated similar to the portion of bank zero 100a and the portion of bank one 100b. In addition, bank two 30c and bank three 30d of DDR SDRAM 10 are treated similar to bank zero 30a and bank one 30b.

To reduce the size of DDR SDRAM 10, one of at least two options, cut option one 140 and cut option two 142, can be selected. FIG. 4 illustrates cut options 140 and 142 for the portion of bank zero 100a and the portion of bank one 100b. In the portion of bank zero 100a, cut option one 140 includes blocks 114a and 116a and cut option two 142 includes blocks 110a and 112a. Likewise, in the portion of bank one 100b, cut option one 140 includes blocks 114b and 116b and cut option two 142 includes blocks 110b and 112b.

If cut option one 140 is selected, blocks 114a, 116a, 114b, and 116b are no longer used. Selecting cut option one 140 also makes data lines 124a, 126a, 124b, and 126b no longer needed. With data lines 124a, 126a, 124b, and 126b no longer needed, data lines DL1<8:15>134 and DL2<8:15>136 also are no longer needed and the second eight DQs are no longer needed.

If cut option two 142 is selected, blocks 110a, 112a, 110b, and 112b are no longer used. Selecting cut option two 142 makes data lines 120a, 122a, 120b, and 122b no longer needed. With data lines 120a, 122a, 120b, and 122b no longer needed, data lines DL1<0:7>130 and DL2<0:7>132 also are no longer needed and the first eight DQs are no longer needed.

Selecting cut option one 140 deactivates the portions of the array of memory cells 32 of banks 30a–30d that are electrically coupled to the upper eight DQs. Selecting cut option two 142 deactivates the portions of the array of memory cells 32 of banks 30a–30d that are electrically coupled to the lower eight DQs. Selecting either cut option one 140 or cut option two 142 reduces the addressable memory size of DDR SDRAM 10 by one half. Therefore, with cut option one 140 or cut option two 142 selected, 16 data bits are accessed per read or write operation instead of the original 32 data bits. The DDR SDRAM 10 in a x16 DQ organization is reduced to a x8 organization.

Figure 5:
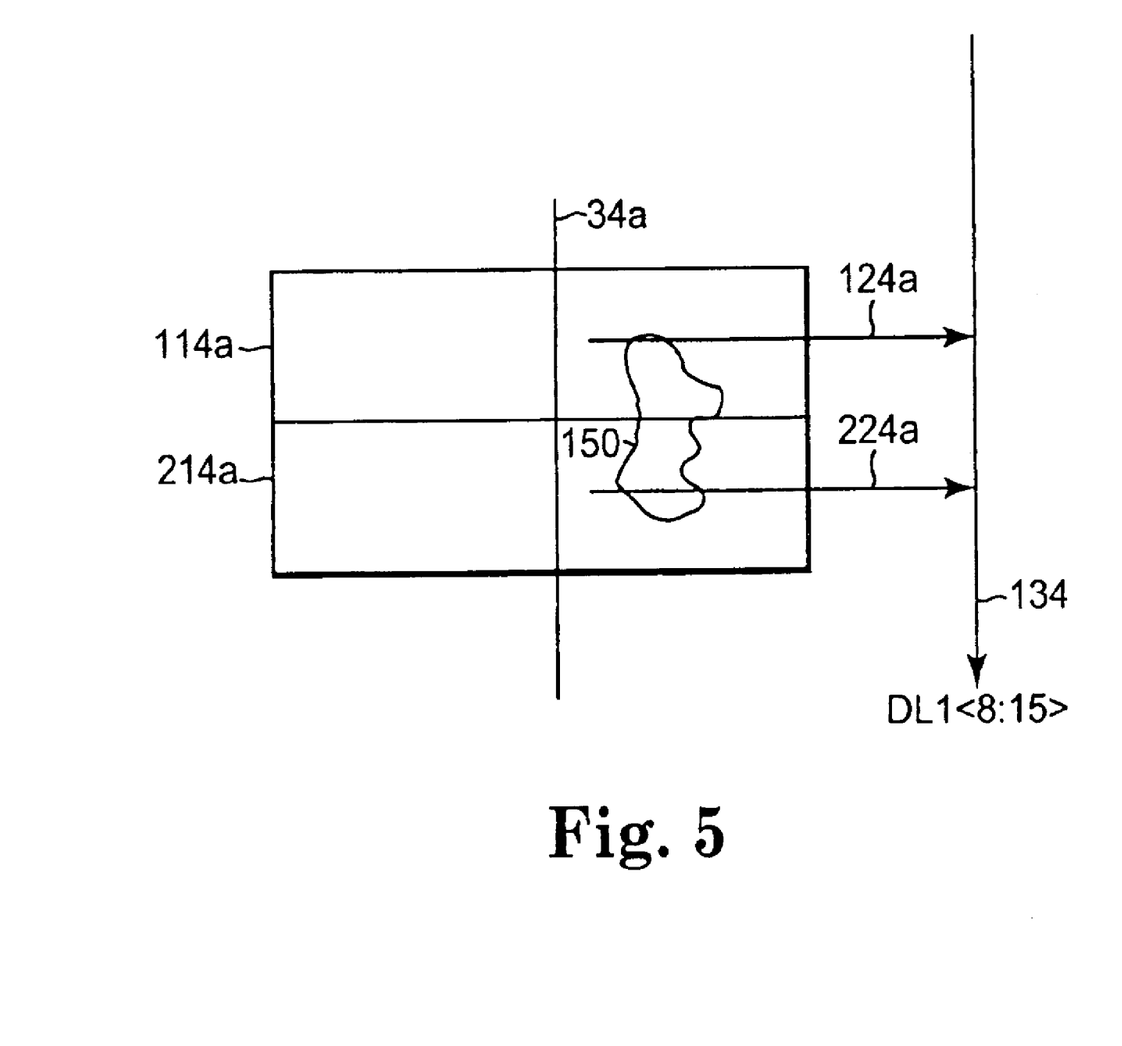
FIG. 5 is a block diagram illustrating an exemplary embodiment of redundancy for a block of memory cells.

FIG. 5 is a diagram illustrating an exemplary embodiment of block 114a and an associated redundant block 214a. Block 114a includes word line 34a, data line 124a, and part of cluster fail 150. Block 214a includes word line 34a, data line 224a, and part of cluster fail 150. The data lines 124a and 224a are electrically coupled to data line DL1<8:15>134.

Block 214a and data line 224a include the same features as block 114a and data line 124a previously described. Block 214a and data line 224a, however, are not used unless a defect, such as a cluster fail, in block 114a or data line 124a prevents block 114a from being used. Similarly, blocks 110a, 112a, 116a, 110b, 112b, 114b, and 116b shown in FIG. 4 also have an associated redundant block and data line.

In the exemplary embodiment, cluster fail 150 extends into block 114a and 214a. Therefore, neither block 114a nor block 214a can be used. Cluster fail 150 renders DDR SDRAM 10 defective, preventing DDR SDRAM 10 from being sold in a x16 DQ organization. By selecting cut option one 140, however, blocks 114a and 214a are no longer used and cluster fail 150 is bypassed. The resulting DDR SDRAM 10 in a x8 organization is not defective and can be sold.

Figure 6:
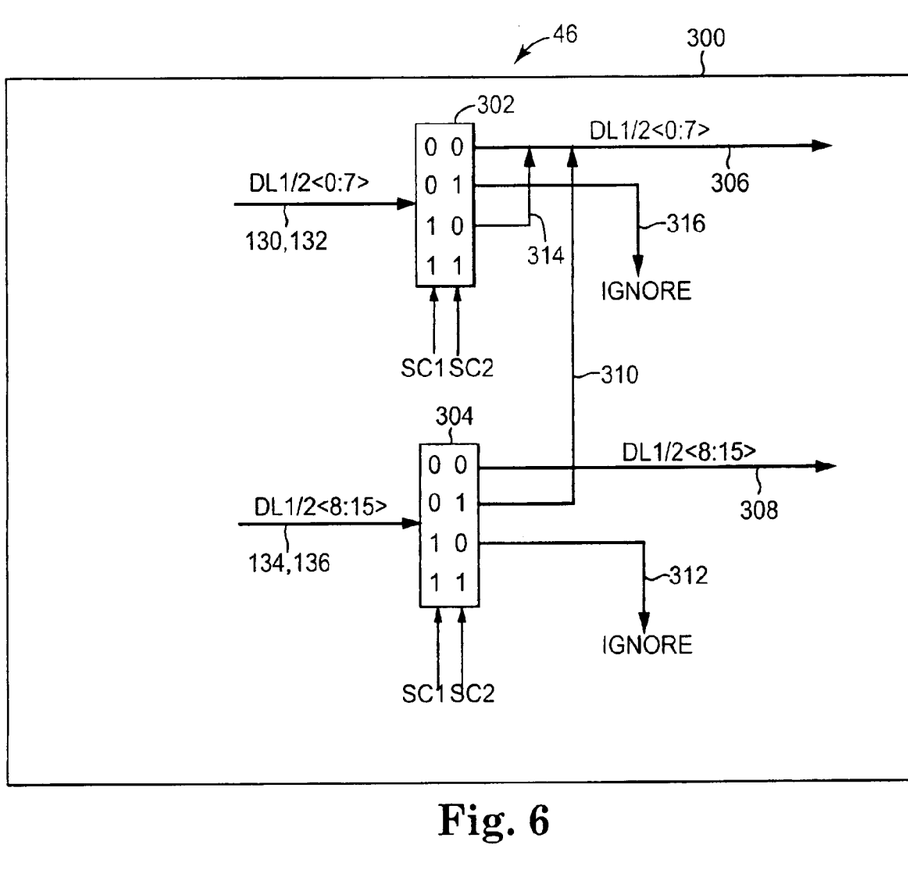
FIG. 6 is a block diagram illustrating an exemplary embodiment of a data line multiplexing circuit for cut down options in a DDR SDRAM.

FIG. 6 is a block diagram illustrating an exemplary embodiment of a data line multiplexing circuit 300 for cut option one 140 and cut option two 142. Multiplexing circuit 300 is part of data in/out circuit 46 and is used to route data to the lower eight DQs if either cut option one 140 or cut option two 142 is selected. Multiplexing circuit 300 includes multiplexers 302 and 304. Multiplexer 302 receives input data lines DL1<0:7>130 and DL2<0:7>132 and select lines cut option one 140 select line (SC1) and cut option two 142 select line (SC2). Multiplexer 304 receives input data lines DL1<8:15>134 and DL2<8:15>136 and select lines SC1 and SC2.

If SC1 is true, indicated as a logic high level (logic 1), and SC2 is false, indicated as a logic low level (logic 0), cut option one 140 is selected. If SC2 is true, indicated as a logic high level (logic 1), and SC1 is false, indicated as a logic low level (logic 0), cut option two 142 is selected. SC1 and SC2 are not both set true as that would result in none of DDR SDRAM 10 being addressable. SC1 and SC2 are shorted to a logic high level or a logic low level during the manufacturing and testing process of DDR SDRAM 10.

Selecting cut option one 140 results in data on data lines DL1<8:15>134 and DL2<8:15>136 being ignored, indicated at 312, and data on data lines DL1<0:7>130 and DL2<0:7>132 passing through to data lines DL1/2<0:7>306, indicated at 314. Selecting cut option two 142 results in data on data lines DL1<8:15>134 and DL2<8:15>136 being passed through to data lines DL1/2<0:7>306, indicated at 310, and data on data lines DL1<0:7>130 and DL2<0:7>132 being ignored, indicated at 316. Selecting neither cut option one 140 nor cut option two 142 results in the data on data lines DL1<0:7>130 and DL2<0:7>132 passing to data lines DL1/2<0:7>306 and data on data lines DL1<8:15>134 and DL2<8:15>136 passing to data lines DL1/2<8:15>308.

Figure 7A:
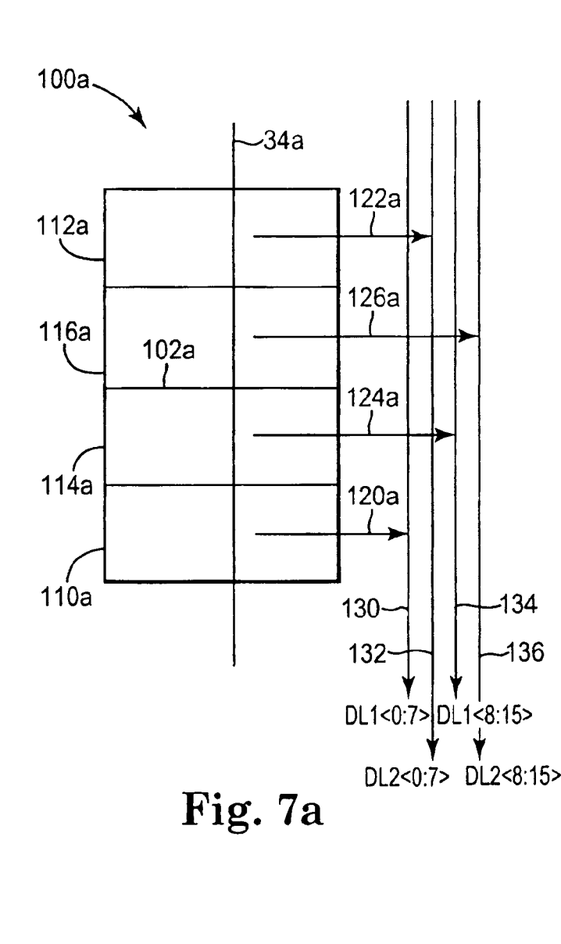
FIGS. 7a and 7b are diagrams illustrating an exemplary embodiment of a 512-Mbit x16 DDR SDRAM reduced to a 256-Mbit x8 DDR SDRAM.
Figure 7B:
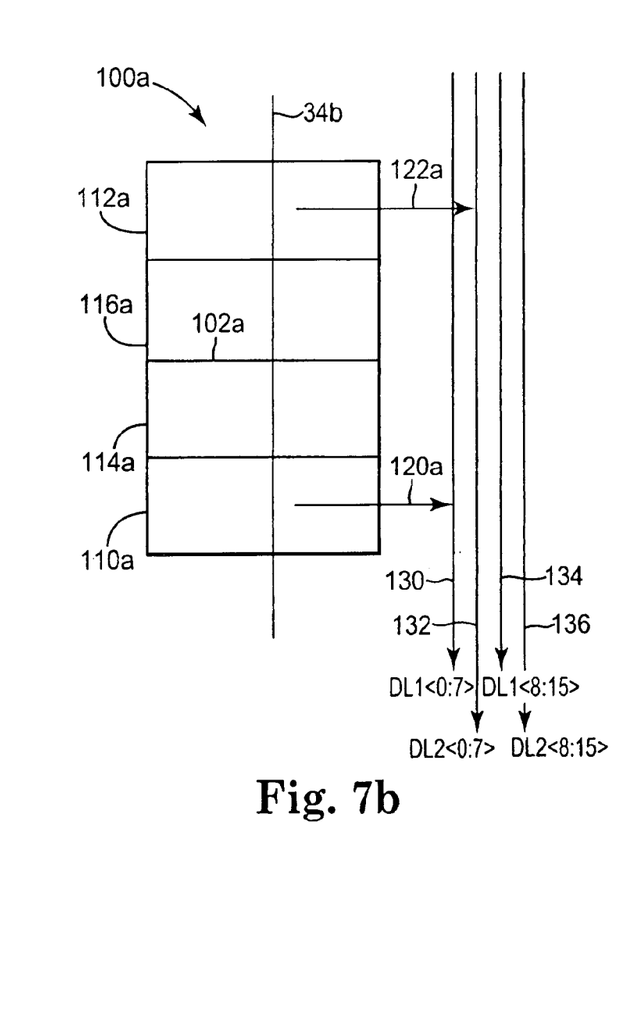

FIGS. 7a and 7b are block diagrams illustrating an exemplary embodiment of the portion of bank zero 100a before and after cut option one 140 is selected. In this embodiment the portion of bank zero 100a illustrated in FIG. 7a is a portion of a 512-Mbit x16 DDR SDRAM with 32 data bits per memory access. The portion of bank zero 100a illustrated in FIG. 7b is a portion of the 512-Mbit x16 DDR SDRAM after it is reduced to a 256-Mbit x8 DDR SDRAM with 16 data bits per memory access.

As illustrated in FIG. 7a, 32 data bits can be accessed during a read or write operation of the 512-Mbit x16 DDR SDRAM. When the 512-Mbit x16 DDR SDRAM is cut down to the 256-Mbit x8 DDR SDRAM illustrated in FIG. 7b, 16 of the data bits can no longer be accessed. The memory cells within blocks 114a and 116a are no longer addressable. In addition, data lines DL1<8:15>134 and DL2<8:15>136 are no longer used. The portions of memory array 32 of banks 30a–30d that are included in cut option one 140 are deactivated (made inaccessible) by blowing fuses for the corresponding bit lines 36, by blowing fuses for the corresponding data lines, or in any other suitable manner.

The 512-Mbit x16 DDR SDRAM with 16 DQs and a 16 k page size is cut down to produce a conforming 256-Mbit x8 DDR SDRAM with eight DQs and an 8 k page size. This same method can apply to other DQ organizations as well. For example, a 512-Mbit x8 DDR SDRAM can be cut down to produce a conforming 256-Mbit x4 DDR SDRAM.

What is claimed is:

1. A random access memory comprising:
   a plurality of data pads;
   an array of memory cells comprising a first portion of memory cells and a second portion of memory cells;
   a first line configured to receive first data signals between the first portion of memory cells and the data pads; and
   a second line configured to receive second data signals between the second portion of memory cells and the data pads, wherein the first portion of memory cells is configured to be made inaccessible to eliminate the first data signals and a first number of the data pads and the second portion of memory cells is configured to be made inaccessible to eliminate the second data signals and a second number of the data pads.

2. The random access memory of claim 1, wherein the first number of the data pads is equal to the second number of the data pads.

3. The random access memory of claim 1, wherein the first portion of memory cells is separate from the second portion of memory cells.

4. The random access memory of claim 1, wherein the first portion of memory cells and the second portion of memory cells have the same number of accessible memory cells.

5. The random access memory of claim 1, wherein the first line comprises a first data bus that receives eight first data signals and the second line comprises a second data bus that receives eight second data signals.

6. The random access memory of claim 1, further comprising:
   word lines extending along rows of the array of memory cells; and
   bit lines extending along columns of the array of memory cells, wherein a memory cell is located at each cross point of one of the word lines and one of the bit lines.

7. The random access memory of claim 6, wherein a first portion of the bit lines is electrically coupled to the first line and a second portion of the bit lines is electrically coupled to the second line.

8. The random access memory of claim 1, wherein the first portion of memory cells stores even data and odd data and the second portion of memory cells stores even data and odd data.

9. The random access memory of claim 1, wherein the memory has a page length of 16 k bits.

10. The random access memory of claim 1, wherein the memory has a page length of 8 k bits.

11. The random access memory of claim 1, wherein the first line comprises a fuse to be blown to deactivate the first portion of memory cells and the second line comprises a fuse to be blown to deactivate the second portion of memory cells.

12. The random access memory of claim 1, comprising a multiplexer configured to select the first data signals and the second data signals and provide the selected signals to the data pads.

13. A random access memory comprising:
   an array of memory cells;
   first lines crossing the array of memory cells and configured to select rows of memory cells in the array of memory cells; and
   second lines crossing the first lines at memory cells in the array of memory cells and configured to select columns of memory cells in the array of memory cells, wherein the selected columns of memory cells communicate with data pads and the array of memory cells is configured to be reduced to eliminate a number of the selected columns of memory cells that communicate with the data pads.

14. The random access memory of claim 13, wherein each of the second lines comprises a fuse to be blown to reduce the array of memory cells.

15. The random access memory of claim 13, wherein the array of memory cells is configured to be reduced with a first cut option to one half of the array of memory cells and with a second cut option to the other half of the array of memory cells.

16. The random access memory of claim 13, wherein the array of memory cells is configured to be reduced to one half of the array of memory cells with a first cut option and the other half of the array of memory cells with a second cut option, wherein the one half of the array of memory cells stores even data and odd data and the other half of the array of memory cells stores even data and odd data.

17. The random access memory of claim 13, comprising a multiplexer configured to select data signals from the second lines and provide the selected data signals to the data pads.

18. A random access memory comprising:
   banks of addressable memory cells;
   data pads configured to receive data signals;
   means for communicating the data signals between the banks and the data pads; and
   means for reducing the data pads and the addressable memory cells.

19. The random access memory of claim 18, wherein the means for reducing comprises means for reducing the data pads by one half.

20. The random access memory of claim 18, wherein the means for reducing comprises means for reducing the addressable memory cells by one half.

21. The random access memory of claim 18, wherein the means for reducing comprises means for providing a first cut option and a second cut option and the means for communicating comprises a multiplexer configured to select the data signals based on the first cut option and the second cut option to communicate the data signals between the banks and the data pads.

22. The random access memory of claim 18, wherein the means for reducing comprises fuses in the means for communicating.

23. A method for reducing storage capacity in a random access memory, comprising:
   preventing access to portions of the random access memory; and
   eliminating data pads electrically coupled to the portions of the random access memory where access is prevented.

24. The method of claim 23, wherein preventing access comprises blowing fuses on data lines electrically coupled to the data pads.

25. The method of claim 23, wherein eliminating data pads comprises reducing the data pads from 16 data pads to 8 data pads.

26. The method of claim 23, wherein eliminating data pads comprises reducing the data pads from 8 data pads to 4 data pads.

27. The method of claim 23, wherein preventing access reduces a page length of the random access memory from 16 k bits to 8 k bits.

28. The method of claim 23, wherein preventing access reduces addressable memory in the random access memory from 512M bits to 256M bits.

29. A random access memory comprising:
   a plurality of data pads comprising a first portion of data pads and a second portion of data pads;
   an array of memory cells comprising a first portion of memory cells and a second portion of memory cells;
   a plurality of word lines extending along rows of the array of memory cells; and
   a plurality of bit lines extending along columns of the array of memory cells comprising a first portion of bit lines and a second portion of bit lines;
   wherein a memory cell is located at each cross point of one of the word lines and one of the bit lines, the first portion of data pads is electrically coupled to the first portion of memory cells through the first portion of bit lines and the second portion of data pads is electrically coupled to the second portion of memory cells through the second portion of bit lines, the first portion of memory cells is configured to be made inaccessible by decoupling the first portion of data pads from the first portion of memory cells, and the second portion of memory cells is configured to be made inaccessible by decoupling the second portion of data pads from the second portion of memory cells.

30. The random access memory of claim 29, wherein the bit lines comprise fuses for decoupling the first portion of data pads from the first portion of memory cells and the second portion of data pads from the second portion of memory cells.

31. The random access memory of claim 29, comprising a multiplexer electrically coupled to the first and second portions of bit lines and the first and second portions of data pads, the multiplexer configured to selectively couple the first and second portions of bit lines to the first and second portions of data pads.

32. The random access memory of claim 29, wherein one half of the first portion of memory cells stores even data and the other half of the first portion of memory cells stores odd data and one half of the second portion of memory cells stores even data and the other half of the second portion of memory cells stores odd data.

33. A dynamic random access memory comprising:

a plurality of data pads;

an array of memory cells comprising a first portion of memory cells and a second portion of memory cells;

a first line configured to receive first data signals between the first portion of memory cells and the data pads; and a second line configured to receive second data signals between the second portion of memory cells and the data pads, wherein the first portion of memory cells is configured to be made inaccessible to eliminate the first data signals and a first number of the data pads and the second portion of memory cells is configured to be made inaccessible to eliminate the second data signals and a second number of the data pads.

34. The dynamic random access memory of claim 33, wherein the dynamic random access memory is a synchronous dynamic random access memory.

35. The dynamic random access memory of claim 33, wherein the dynamic random access memory is a double data rate synchronous dynamic random access memory.

\* \* \* \* \*